(12) United States Patent
Lin et al.

(10) Patent No.: US 8,921,819 B2
(45) Date of Patent: Dec. 30, 2014

(54) RESISTIVE RANDOM ACCESS MEMORY AND FABRICATION METHOD THEREOF

(71) Applicant: Powerchip Technology Corporation, Hsinchu (TW)

(72) Inventors: Chan-Ching Lin, Taipei (TW); Chen-Hao Huang, Miaoli County (TW); Tzung-Bin Huang, Hsinchu (TW); Chun-Cheng Chen, Changhua County (TW); Ching-Hua Chen, Hsinchu (TW)

(73) Assignee: Powerchip Technology Corporation, Hsinchu Science Park, Hsinchu (TW)

( * ) Notice: Subject to any disclaimer, the term of this patent is extended or adjusted under 35 U.S.C. 154(b) by 92 days.

(21) Appl. No.: 13/674,967

(22) Filed: Nov. 13, 2012

(65) Prior Publication Data

US 2014/0091273 A1    Apr. 3, 2014

(30) Foreign Application Priority Data

Oct. 3, 2012    (TW) .............................. 101136533 A

(51) Int. Cl.
*H01L 45/00*    (2006.01)
*H01L 21/02*    (2006.01)

(52) U.S. Cl.
USPC .. 257/4; 438/382; 257/E45.001; 257/E21.004

(58) Field of Classification Search
CPC ................................ H01L 45/04; H01L 45/00
USPC ............................................................ 257/4
See application file for complete search history.

(56) References Cited

U.S. PATENT DOCUMENTS

| | | | |
|---|---|---|---|
| 8,399,874 B2 * | 3/2013 | Hwang | 257/2 |
| 2009/0184396 A1 | 7/2009 | Kim et al. | |
| 2009/0321878 A1 * | 12/2009 | Koo et al. | 257/536 |
| 2011/0031463 A1 * | 2/2011 | Sato et al. | 257/4 |
| 2011/0085368 A1 * | 4/2011 | Kim et al. | 365/63 |
| 2012/0112156 A1 * | 5/2012 | Park et al. | 257/5 |
| 2012/0181498 A1 | 7/2012 | Hwang | |
| 2013/0010520 A1 * | 1/2013 | Murooka | 365/148 |

\* cited by examiner

*Primary Examiner* — Kimberly Rizkallah
*Assistant Examiner* — Mounir Amer
(74) *Attorney, Agent, or Firm* — Winston Hsu; Scott Margo

(57) ABSTRACT

A resistive random access memory (RRAM) unit includes at least one bit line extending along a first direction, at least one word line disposed on a substrate and extending along a second direction so as to intersect the bit line, a hard mask layer on the word line to isolate the word line from the bit line, a first memory cell on a sidewall of the word line, and a second memory cell on the other sidewall of the word line.

11 Claims, 20 Drawing Sheets

RESISTIVE RANDOM ACCESS MEMORY AND FABRICATION METHOD THEREOF

BACKGROUND OF THE INVENTION

1. Field of the Invention

The present invention relates generally to the field of semiconductor memory devices. More particularly, the present invention relates to an improved resistive random access memory (RRAM) device, which utilizes spacer-type resistance layer and top electrode and has a cell size of $2F^2$. A method of fabricating such RRAM device is also disclosed.

2. Description of the Prior Art

Resistive switching random access memory or RRAM devices have certain beneficial characteristics over other types of memory devices, such as low power consumption, high speed, excellent bit resolution, high degree of scaling of miniaturization, non-volatile, and low cost, and therefore have become a promising next-generation non-volatile memory to replace flash memory.

RRAM may be characterized by a resistor or a resistance layer disposed between a top electrode and a bottom electrode of a storage node, which may be fabricated in a semiconductor pillar structure and stacked with a diode. The resistor may have a current-voltage characteristic which may be varied according to an applied voltage. Once the current-voltage characteristic is varied, the varied current-voltage characteristic of the resistor may be maintained until a reset voltage is applied to the resistor. RRAM devices store data by varying the resistance of the resistor between a high resistance state (HRS) and a low resistance state (LRS), arguably due to the formation/collapse of conduction filaments in the resistance layer. Data may be written to a selected RRAM device by applying a predetermined voltage, at a predetermined polarity, for a predetermined duration. To ensure the stability when operating the RRAM device, it is believed that maintaining a certain amount of the conduction filaments is essential.

It is also believed that, when the RRAM device is operated, the quantity of conduction filaments is proportional to the contact area between the resistance layer and the electrode. As the size of the memory cell shrinks, however, the variation or deviation of the quantity of conduction filaments created during the operation of the RRAM device becomes critical and may significantly influence the device reliability. Accordingly, there is a need in this industry to provide an improved RRAM structure and fabrication method thereof to solve the above-mentioned problems or shortcomings.

SUMMARY OF THE INVENTION

To achieve the above-described purposes, a resistive random access memory (RRAM) device on a substrate is provided according to one embodiment. The RRAM device includes at least one bit line extending along a first direction; at least one word line extending along a second direction and intersecting the bit line; a hard mask layer on the word line to electrically isolate the word line from the bit line; a first memory cell disposed on one sidewall of the word line, the first memory cell comprising a first spacer-type resistance layer, a first top electrode, and a first diode coupled to the first top electrode; and a second memory cell disposed on the other sidewall of the word line, the second memory cell comprising a second spacer-type resistance layer, a second top electrode, and a second diode coupled to the second top electrode.

According to another embodiment, a method of fabricating a resistive random access memory (RRAM) device is disclosed. A plurality of word lines extending along a first direction are formed on a substrate with a recess between the word lines. A spacer-type resistance layer and a top electrode layer are formed on a sidewall of each of the word lines. A photoresist stripe pattern extending along a second direction is then formed on the substrate. The first direction is perpendicular to the second direction. An etching process is performed to remove the top electrode layer and the spacer-type resistance layer not covered by the photoresist stripe pattern to form a plurality of top electrodes. A diode is formed on each of the top electrodes.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
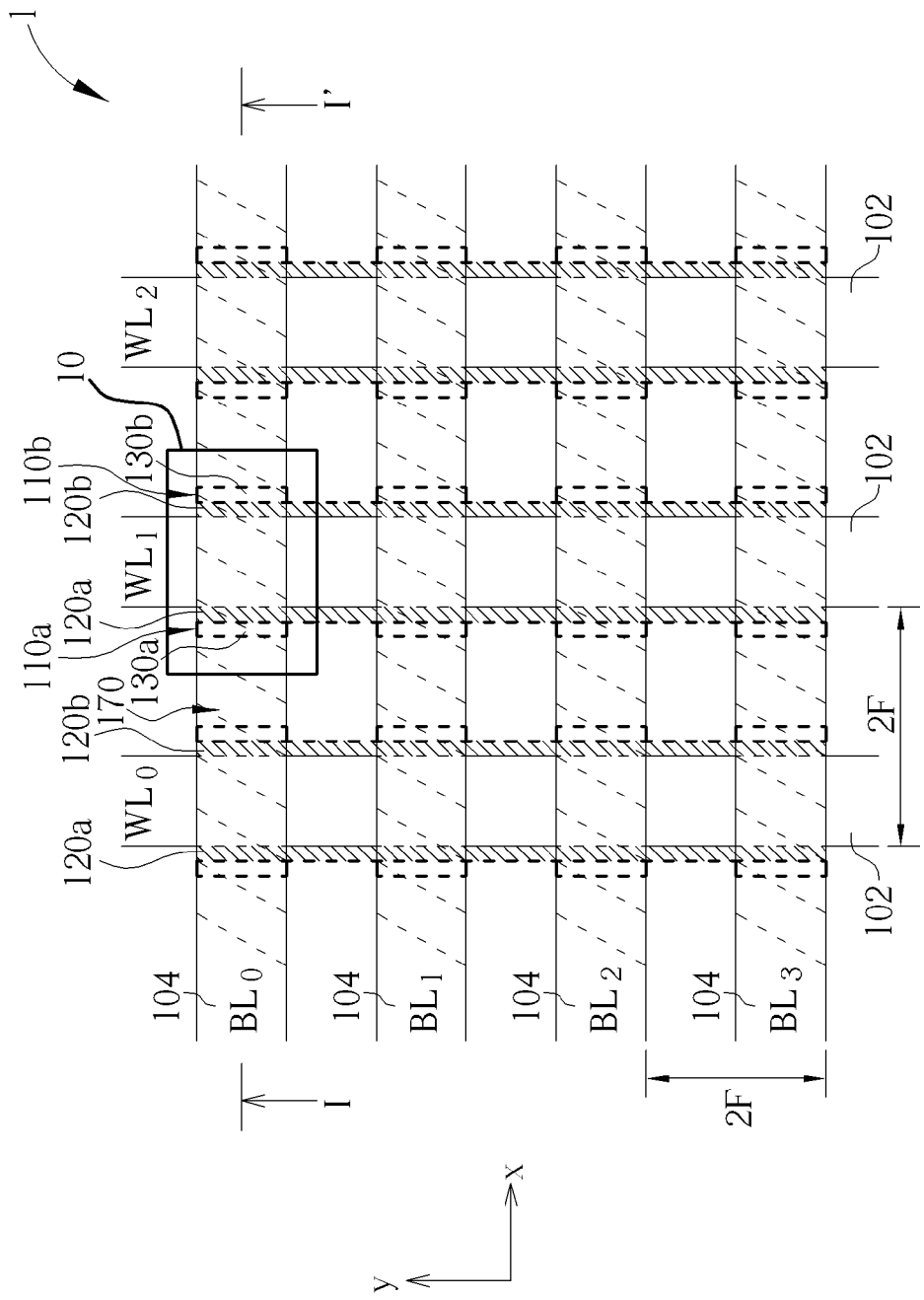
FIG. 1 is a schematic diagram showing a portion of a resistive random access memory (RRAM) array in accordance with one embodiment of this invention.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

Figure 2:
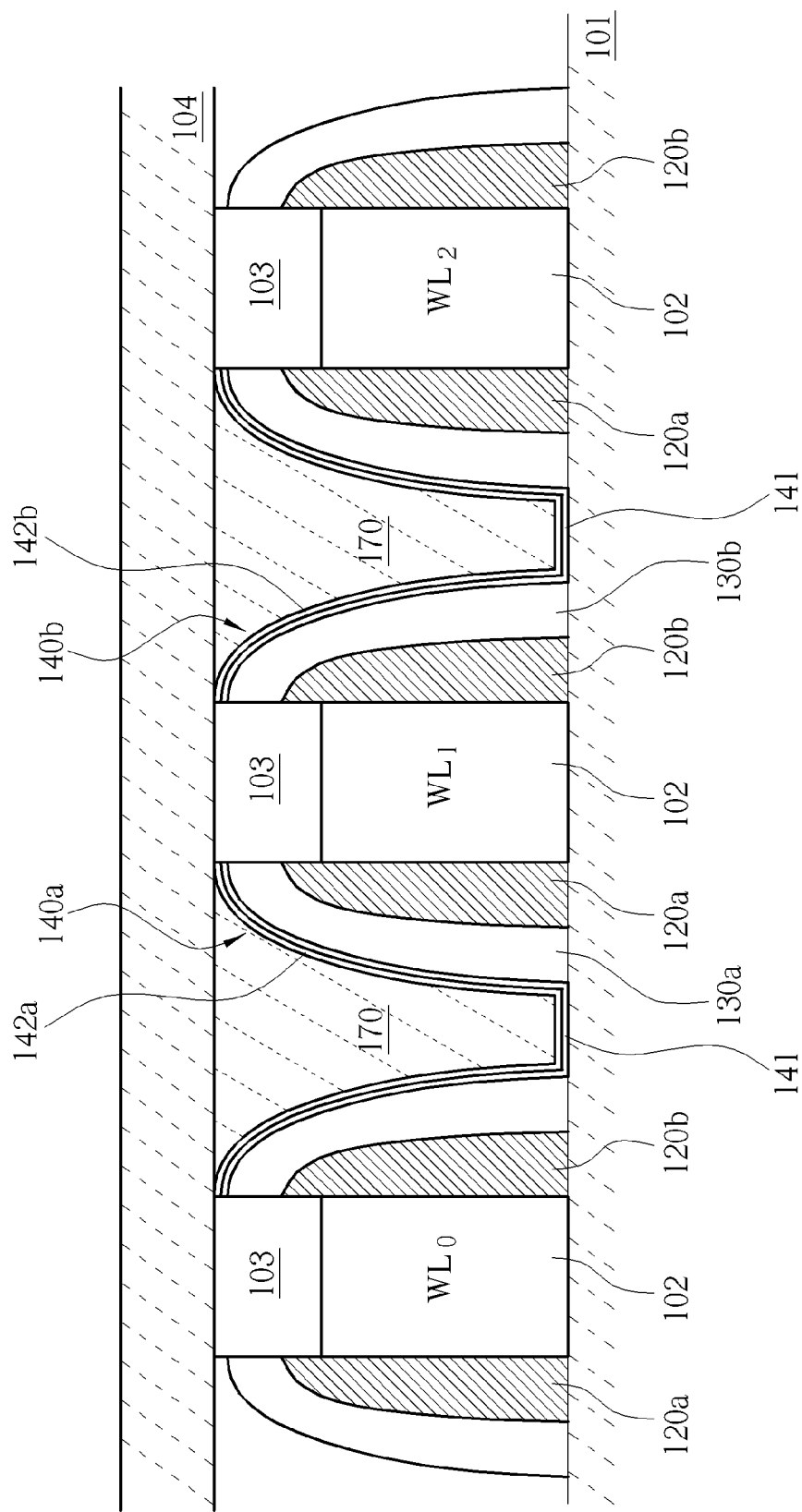
FIG. 2 is a schematic, cross-sectional diagram taken along line I-I' in FIG. 1.

Please refer to FIG. 1 and FIG. 2. FIG. 1 is a schematic diagram showing a portion of a resistive random access memory (RRAM) array in accordance with one embodiment of this invention. FIG. 2 is a schematic, cross-sectional diagram taken along line I-I' in FIG. 1. As shown in FIG. 1 and FIG. 2, the RRAM array 1 comprises a plurality of bit lines 104, for example, BL0~BL3, extending along a first direction such as the reference x-axis, and a plurality of word lines 102, for example, WL0~WL2, extending along a second direction such as the reference y-axis. The first direction may be perpendicular to the second direction. The word lines 102 intersect the bit lines 104 and a memory cell unit 10 is provided at each cross point.

According to the embodiment of this invention, the word lines 102, which extend along the second direction, are formed on a surface of a base layer or substrate 101 with a pitch of 2F, where F is the minimum feature size or line width. According to the embodiment of this invention, the word lines 102 may comprise metal such as titanium nitride (TiN), but not limited thereto. A hard mask layer 103 such as silicon nitride may be provided on each of the word lines 102. The hard mask layer 103 insulates the word lines 102 from the overlying bit lines 104 extending along the first direction.

According to the embodiment of this invention, the memory cell unit 10 at each cross point of the word lines 102 and bit lines 104 comprises two memory cells 110a and 110b, which are formed on two opposite sidewalls of the word line 102 such as WL1. For example, the memory cell 110a comprises a spacer-type resistance layer 120a and a spacer-type top electrode 130a on the left side of WL1, and the memory cell 110b comprises a spacer-type resistance layer 120b and a spacer-type top electrode 130b on the right side of WL1, thereby forming a dual spacer configuration on either sidewall of the word line. The word line 102 acts as a bottom electrode of each memory cell. Therefore, a minimum cell size of $2F^2$ can be achieved.

According to the embodiment of this invention, the spacer-type resistance layers 120a and 120b are both in direct contact with the word line 102. The top electrodes 130a and 130b are in direct contact with the resistance layers 120a and 120b respectively. It is noteworthy that the spacer-type resistance layers 120a and 120b must cover the entire sidewall surface and may slightly extend upward to cover a portion of the hard mask layer 103. This avoids the direct contact between the top electrode 130a, 130b and the word line 102.

In FIG. 1, according to the embodiment of this invention, the exemplary spacer-type resistance layer 120a, 120b is continuous and extends along the second direction on either sidewall of the word line 102. The top electrode 130a, 130b is non-continuous and segmented. However, it is to be understood that the spacer-type resistance layer 120a, 120b may be non-continuous and segmented in another embodiment.

According to the embodiment of this invention, the spacer-type resistance layer 120a, 120b may comprise hafnium dioxide ($HfO_2$), but not limited thereto. It is to be understood that the spacer-type resistance layer 120a, 120b may comprise other resistance change materials such as $ZrO_2$, $TiO_2$, $Cu_xO$, or $Al_2O_3$ among others. According to the embodiment of this invention, the top electrodes 130a and 130b may comprise TiN, but not limited thereto. When choosing the suitable material for the top electrodes 130a and 130b, the proper metal work function may be taken into account so as to form NP diode and PN diode on two opposite sides of the word line 102.

As shown in FIG. 2, according to the embodiment of this invention, the memory cell 110a further comprises an NP diode 140a that is electrically coupled to the top electrode 130a, and the memory cell 110b further comprises a PN diode 140b that is electrically coupled to the top electrode 130b. According to the embodiment of this invention, NP diode 140a and PN diode 140b may be a metal-tunnel oxide diode, metal diode or metal oxide diode.

Figure 16:
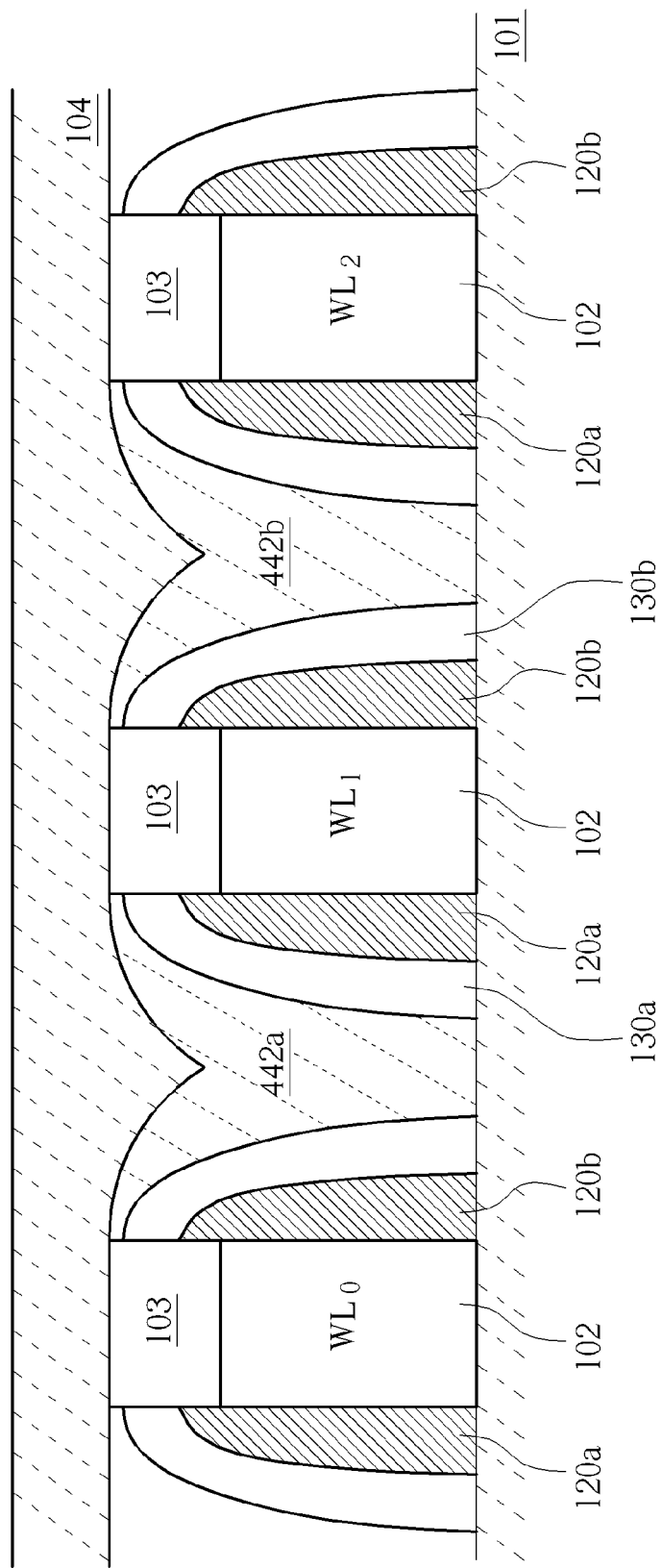
FIG. 16 and FIG. 17 show exemplary RRAM structure with metal diode and metal oxide diode respectively.
Figure 17:
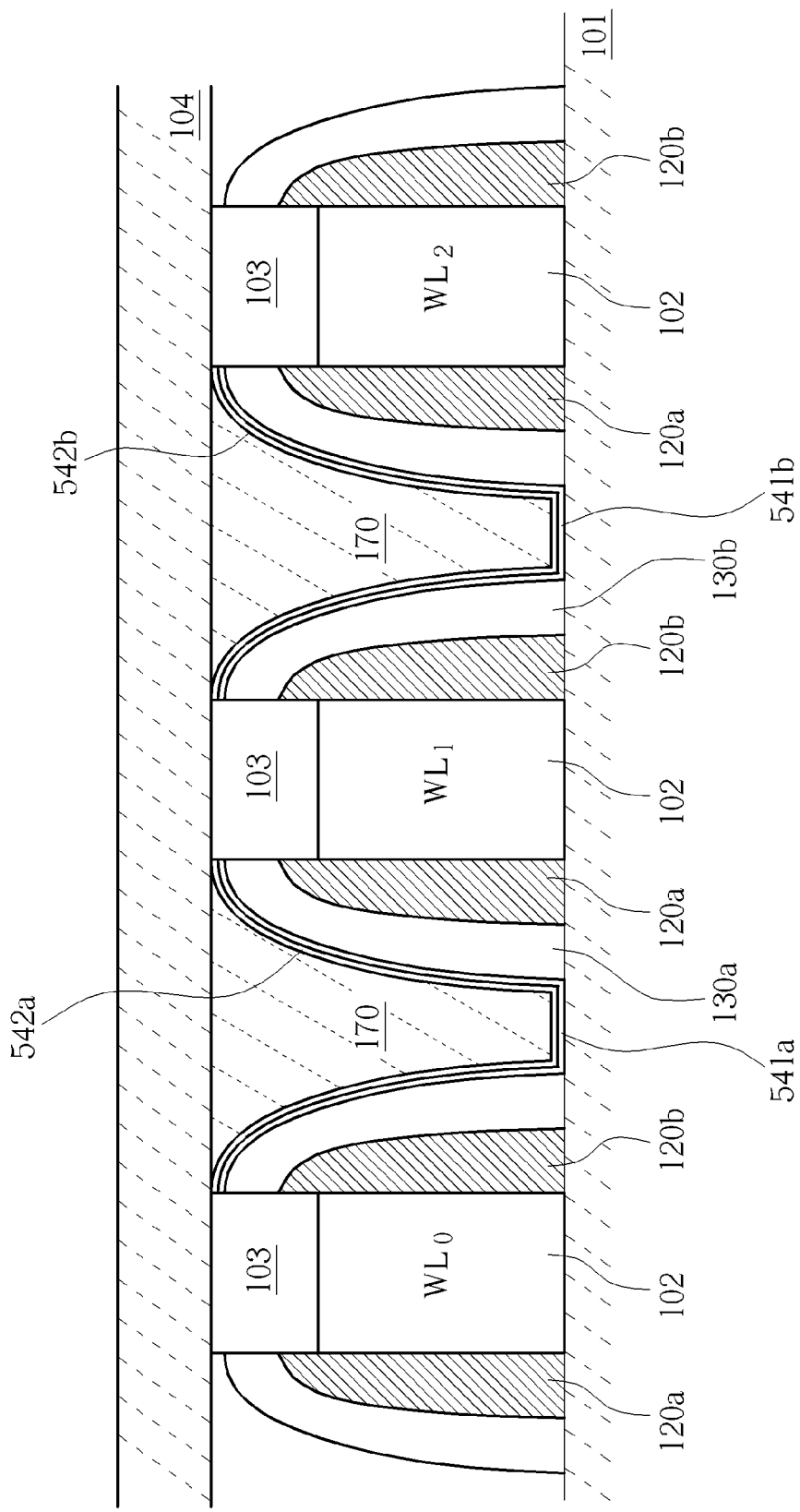

By way of example, FIG. 16 and FIG. 17 show exemplary RRAM structure with metal diode and metal oxide diode respectively. As shown in FIG. 16, a boron-aluminum (B—Al) metal 442a is formed on the left side of WL1, while on the right side of WL1, a phosphorus-aluminum (P—Al) metal 442b is formed. As shown in FIG. 17, composite metal oxide including titanium oxide (TiO) 542a and nickel oxide (NiO) 541a is formed on the left side of WL1 thereby forming an NP metal oxide diode, while composite metal oxide including nickel oxide (NiO) 542b and titanium oxide (TiO) 541b is formed on the right side of WL1 thereby forming a PN metal oxide diode.

In FIG. 2, a metal-tunnel oxide diode structure is shown. The NP diode 140a comprises a tunnel oxide layer 141 covering the top electrode 130a, and a platinum (Pt) layer 142a. The PN diode 140b comprises the tunnel oxide layer 141 covering the top electrode 130b, and a hafnium (Hf) layer 142b. The tunnel oxide layer 141, the Pt layer 142a and the Hf layer 142b conformally covers the recess between the word lines 102, and cover a portion of the substrate 101. According to the embodiment of this invention, the tunnel oxide layer 141 may have a thickness of about 6 nm, but not limited thereto. A contact layer 170 such as tungsten (W) is provided on the Pt layer 142a and the Hf layer 142b. The contact layer 170 fills the recess between the word lines 102 and is electrically connected to the bit line 104 such as BL0. Going into detail, an N electrode (Pt layer) of the NP diode 140a is coupled to the bit line 104 through the contact layer 170, and a P electrode (Hf layer) of the PN diode 140b is coupled to the bit line 104 through the contact layer 170.

Figure 3:
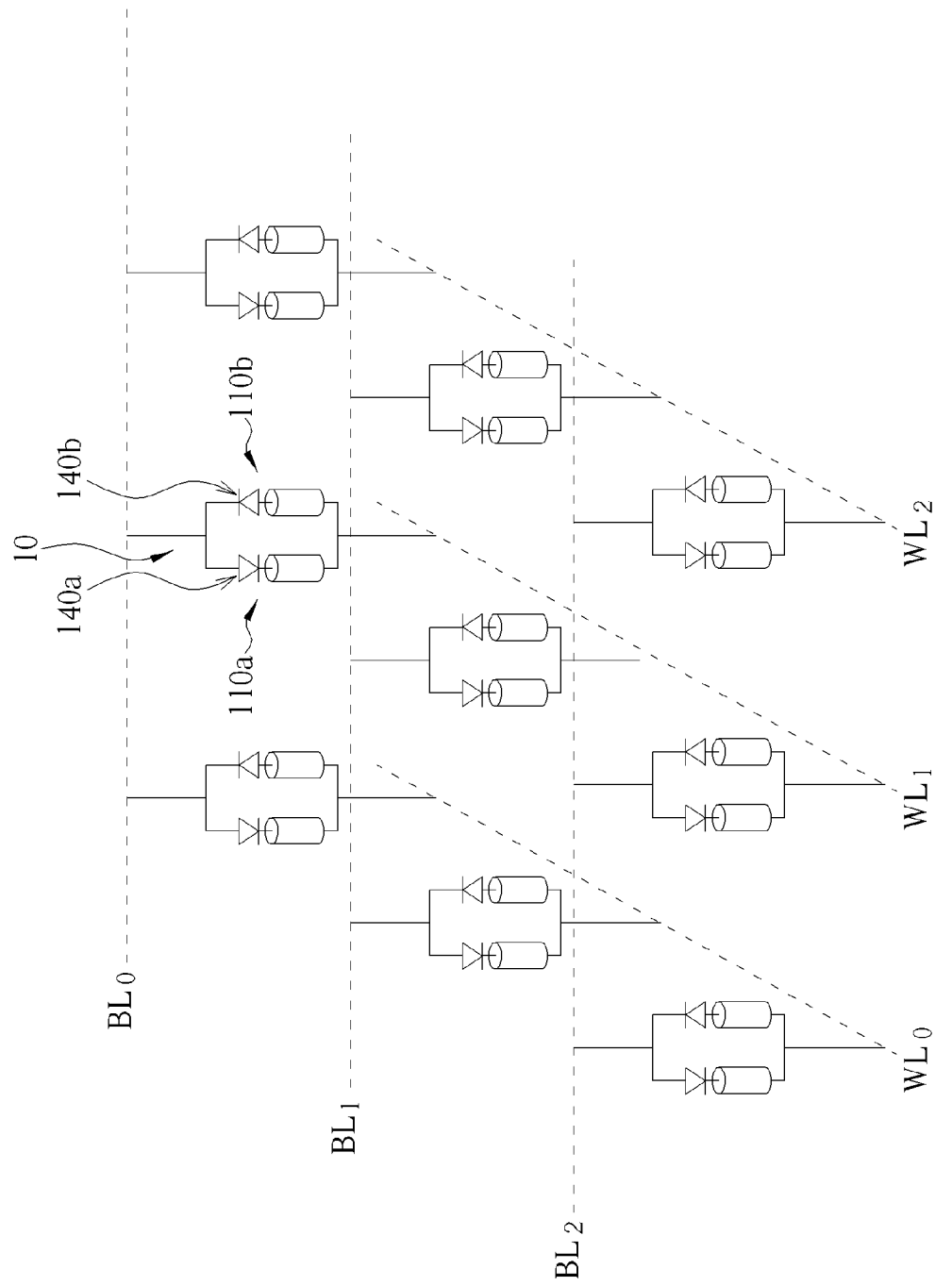
FIG. 3 is an exemplary circuit diagram of the RRAM array according to the embodiment of this invention.

FIG. 3 is an exemplary circuit diagram of the RRAM array according to the embodiment of this invention. By way of example, in FIG. 3, the memory cell unit 10 comprises two memory cells 110a and 110b, which are electrically coupled to the bit line 104 such as BL0 (indicated by dashed line) through the NP diode 140a and PN diode 140b respectively. On the other hand, the spacer-type resistance layers 120a and 120b of the memory cells 110a and 110b respectively are directly connected to the word line 102 such as WL1. It can be seen from FIG. 3 that the NP diode 140a and the PN diode 140b coupled to each bit line 104 are arranged in an inverted configuration. However, it is to be understood that in other cases the two diodes may be unidirectional and is not arranged in such inverted configuration.

Figure 4:
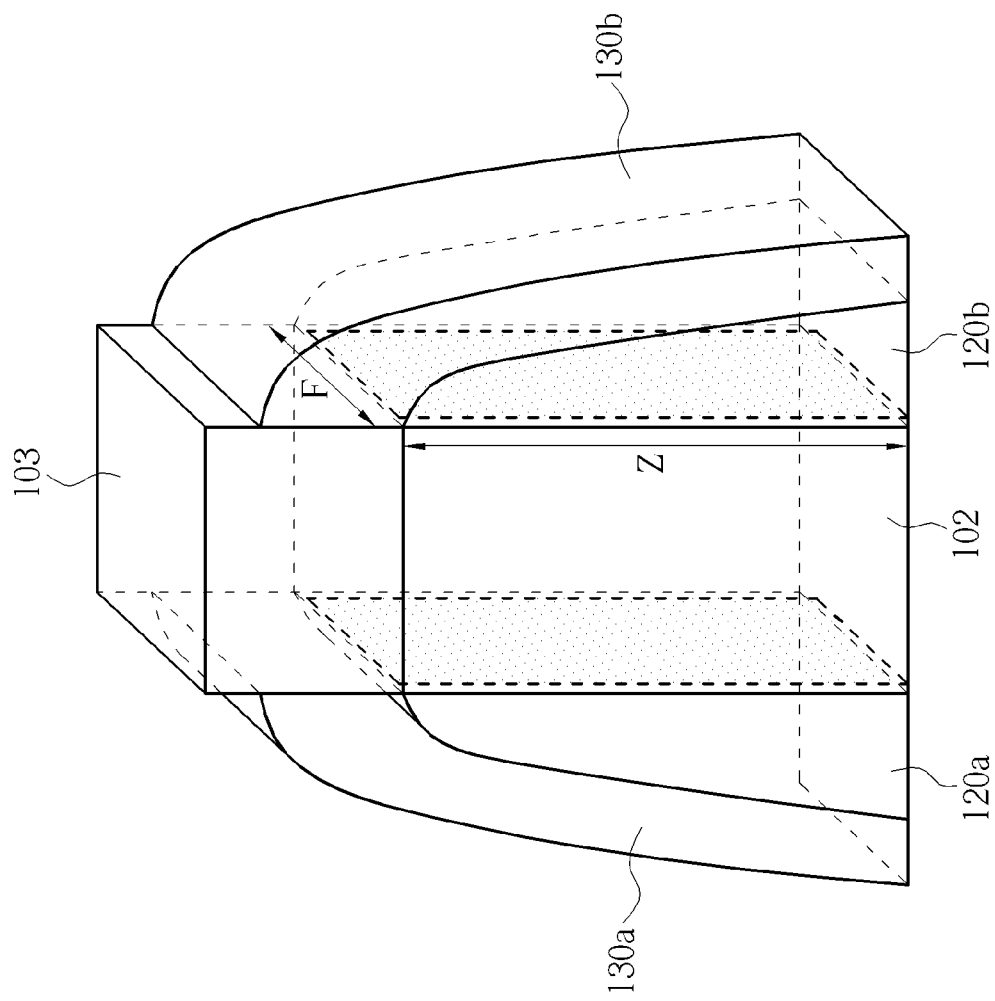
FIG. 4 is a perspective view of the memory cell unit in accordance with one embodiment of this invention.

FIG. 4 is a perspective view of the memory cell unit 10. The present invention features a minimum memory cell size of $2F^2$ by forming two memory cells 110a and 110b on two opposite sidewalls of the word line 102. With the scaling of the memory cell unit 10 due to the improvement of the semiconductor fabrication techniques, an effective surface area A (A=F×Z) can be still maintained by adjusting the thickness Z of the word line 102. As previously described, when the RRAM device is operated, the quantity of conduction filaments is proportional to the contact area A between the resistance layer and the electrode. By adjusting the thickness Z of the word line 102, the influence of the variation of the conduction filaments can be eliminated or alleviated, thereby solving the reliability issue.

Figure 5A:
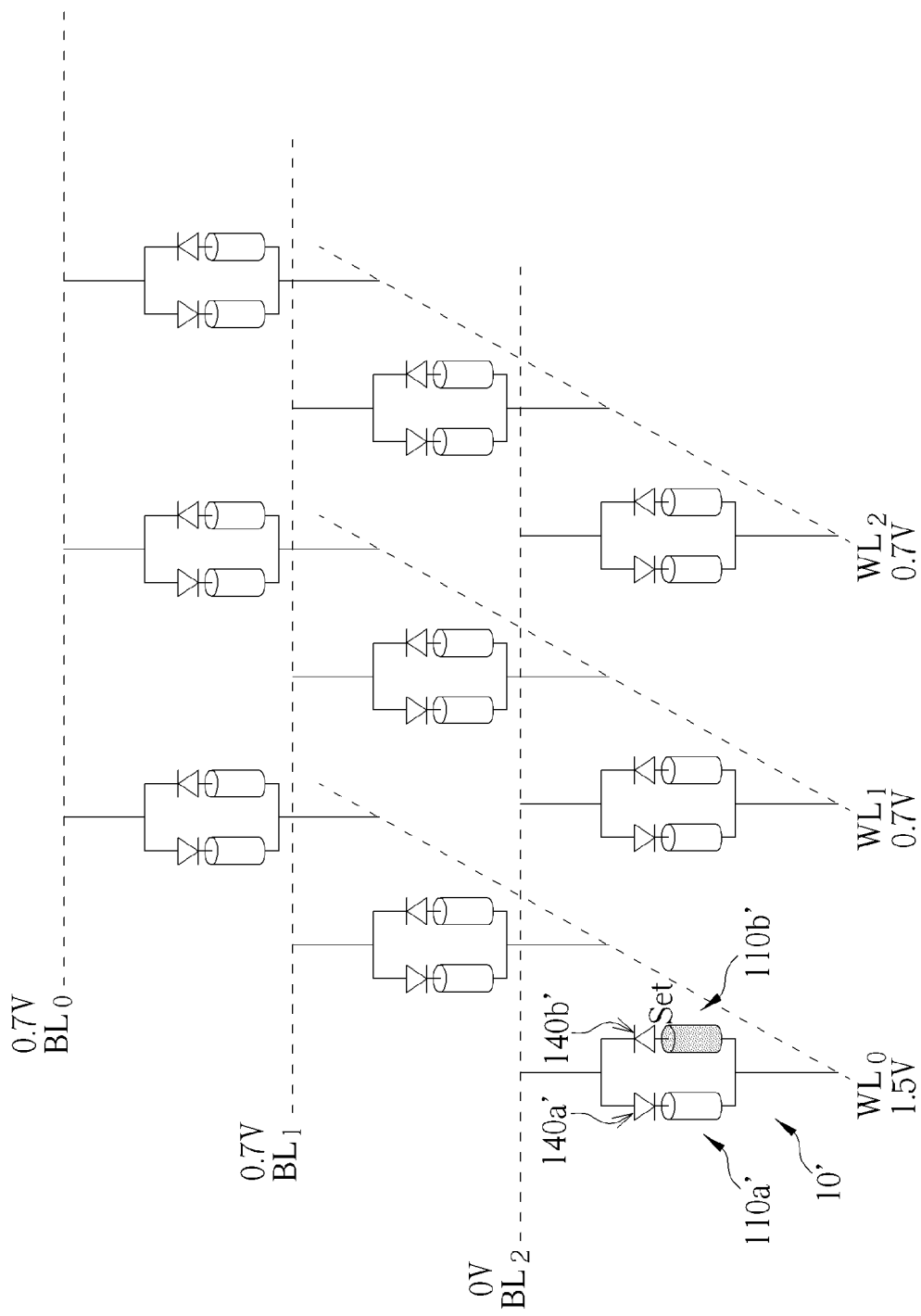
FIG. 5A and FIG. 5B depict exemplary methods for operating the RRAM array in FIG. 3.
Figure 5B:
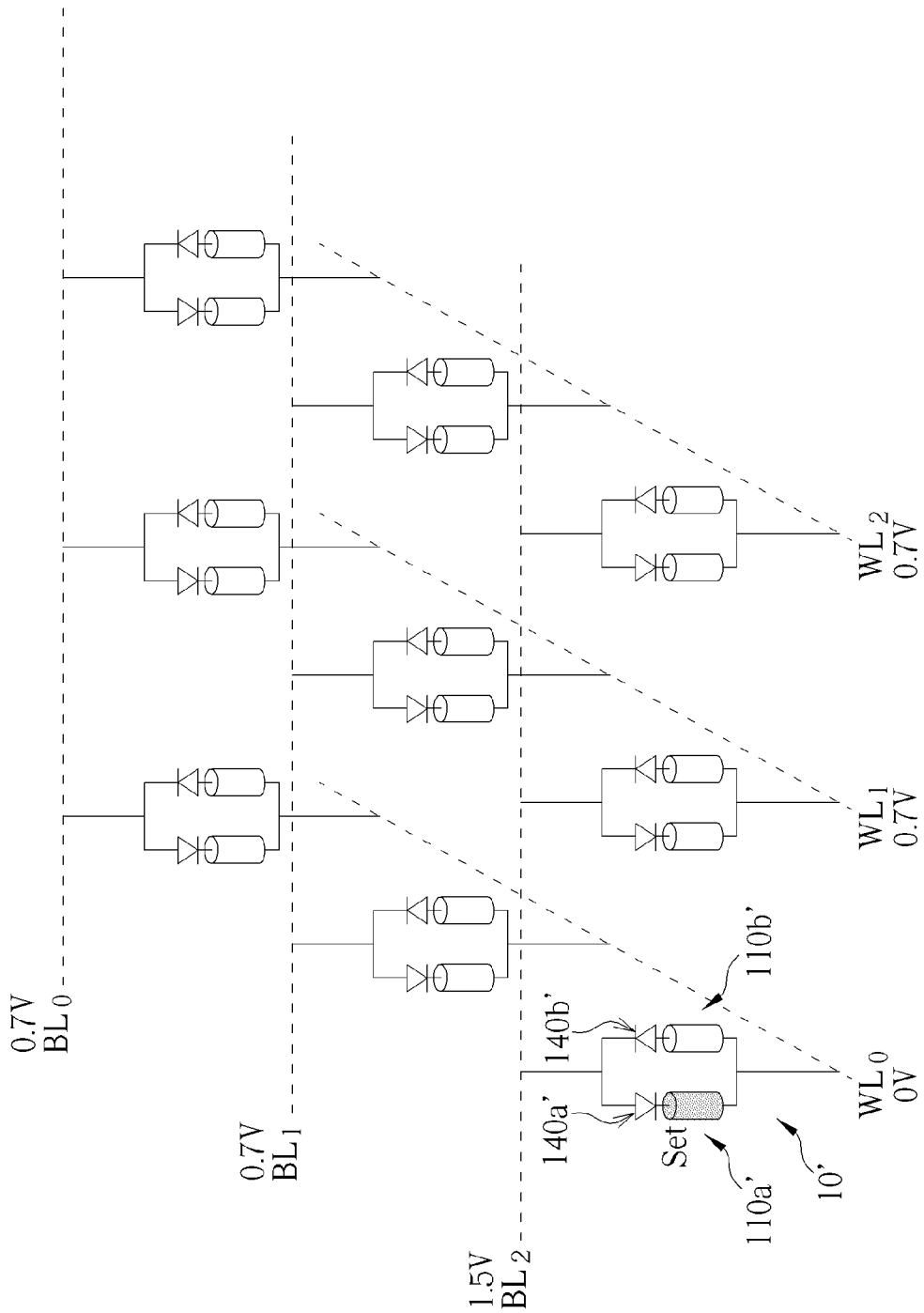

FIG. 5A and FIG. 5B depict exemplary methods for operating the RRAM array in FIG. 3. By way of example, as shown in FIG. 5A, to write the right side memory cell 110b' of the memory cell unit 10' at the cross point of the word line WL0 and the bit line BL2, a 1.5V voltage is applied to WL0, a 0V voltage is applied to BL2, such that the PN diode 140b' is forward biased to conduct current, while the NP diode 140a' is not in a conducted state. A 0.7V voltage is applied to other word lines. A 0.7V voltage is applied to other bit lines. As shown in FIG. 5B, to write the left side memory cell 110a' of the memory cell unit 10' at the cross point of the word line WL0 and the bit line BL2, a 0V voltage is applied to WL0, a 1.5V voltage is applied to BL2, such that the NP diode 140a' is forward biased to conduct current, while the PN diode 140b' is not in a conducted state. Likewise, a 0.7V voltage is applied to other word lines. A 0.7V voltage is applied to other bit lines. It is to be understood that the above voltages are exemplary and are provided only for the purpose of illustration.

A detail description of the fabrication process for forming the RRAM device will now be provided below in accompany with FIG. 6 to FIG. 15.

Figure 6:
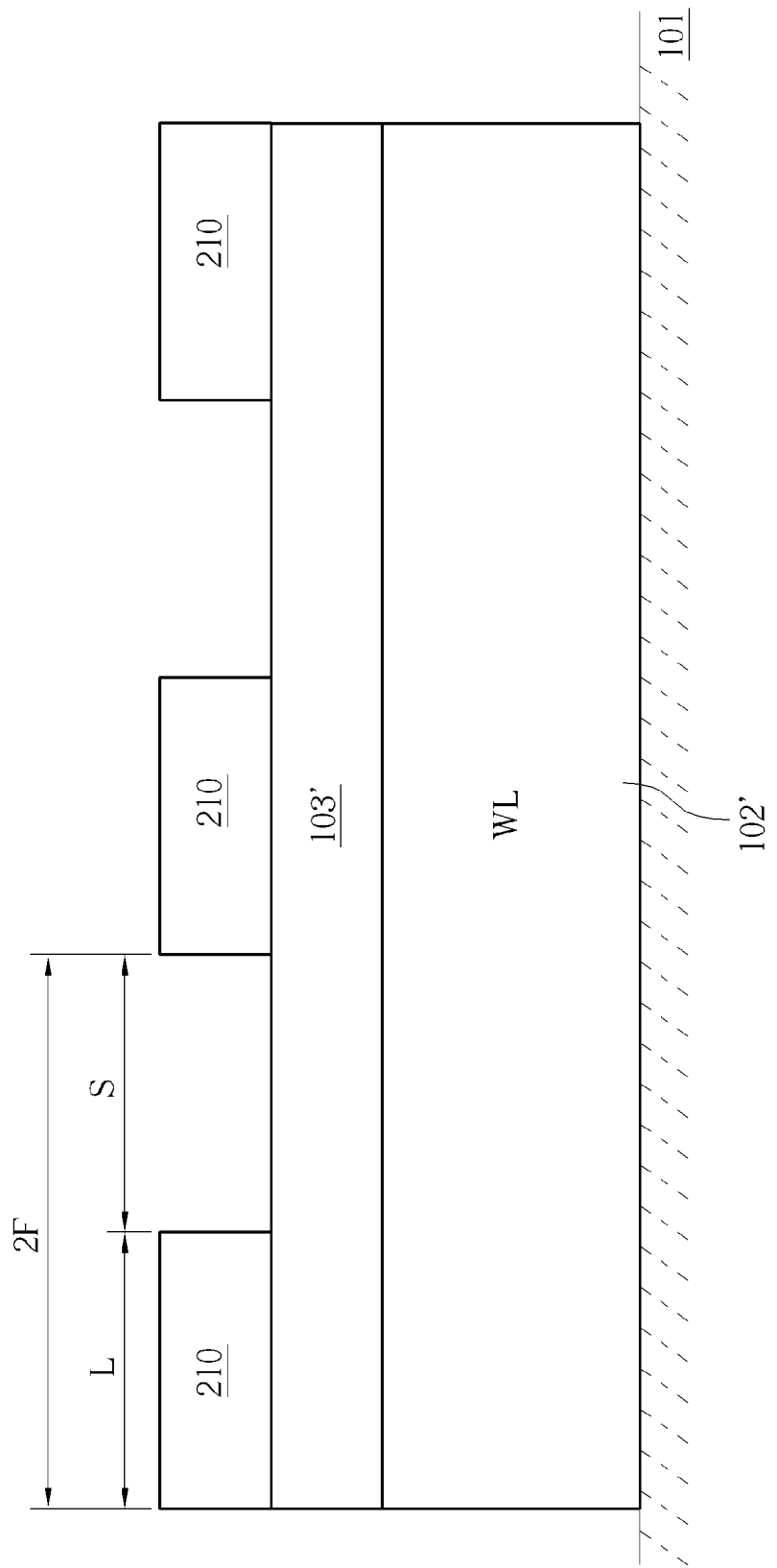
FIG. 6 to FIG. 15 are schematic, cross-sectional diagrams showing a method for fabricating the RRAM device in accordance with one embodiment of this invention.

As shown in FIG. 6, a substrate 101 is provided. The substrate 101 may be a semiconductor substrate or a substrate having thereon an inter-metal dielectric film. For example, the substrate 101 may be a substrate having thereon an inter-metal dielectric film and a peripheral circuit has been fabricated in a front end process and covered by the inter-metal dielectric film. The RRAM device is fabricated directly on the inter-metal dielectric film. A word line material layer 102' and a hard mask material layer 103' are deposited on the substrate 101. A photoresist dense line pattern 210 with a pitch of 2F and L (line width):S (space)=1:1 is then provided on the hard mask material layer 103'.

Figure 7:
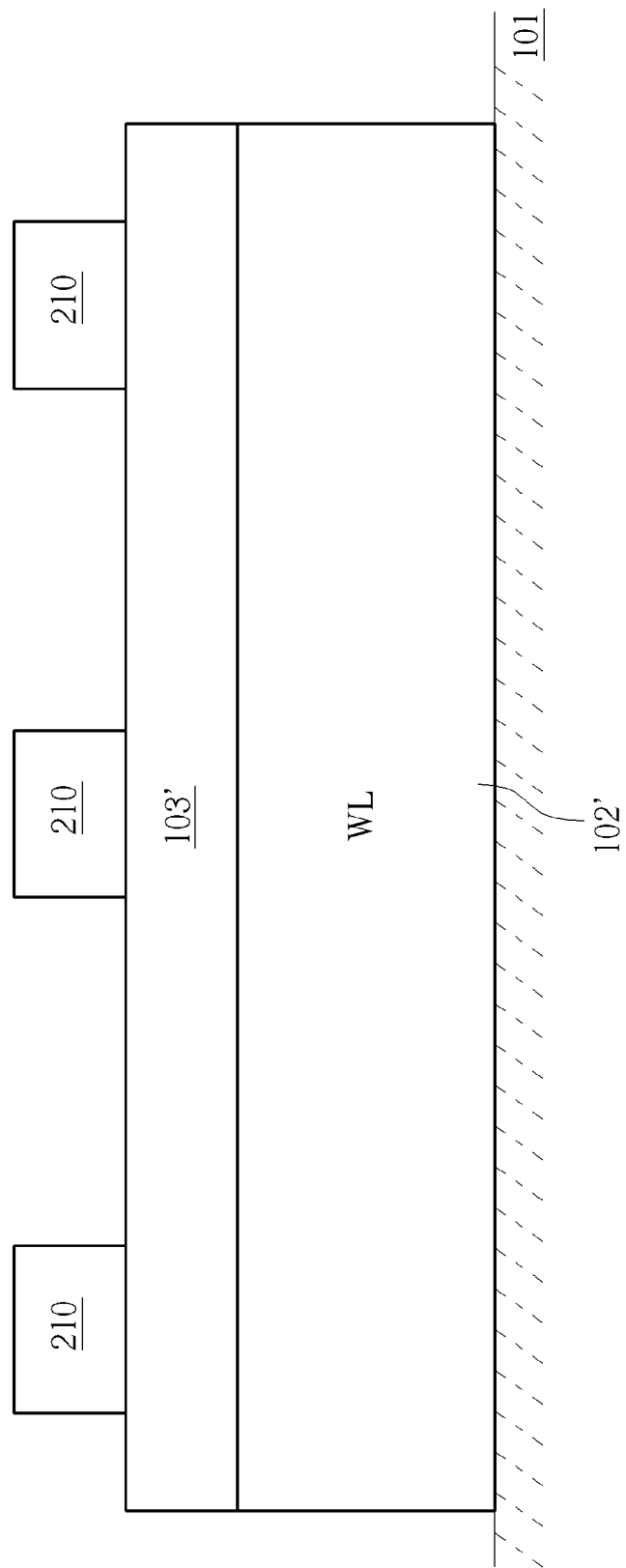
Figure 8:
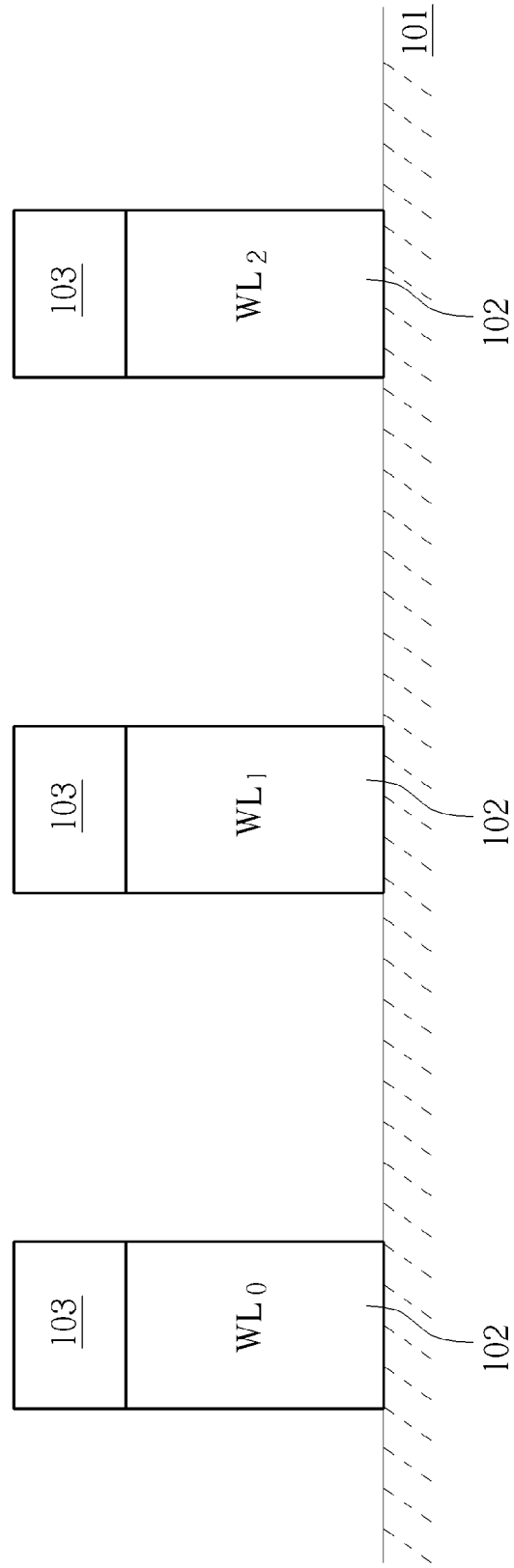
Figure 8A:
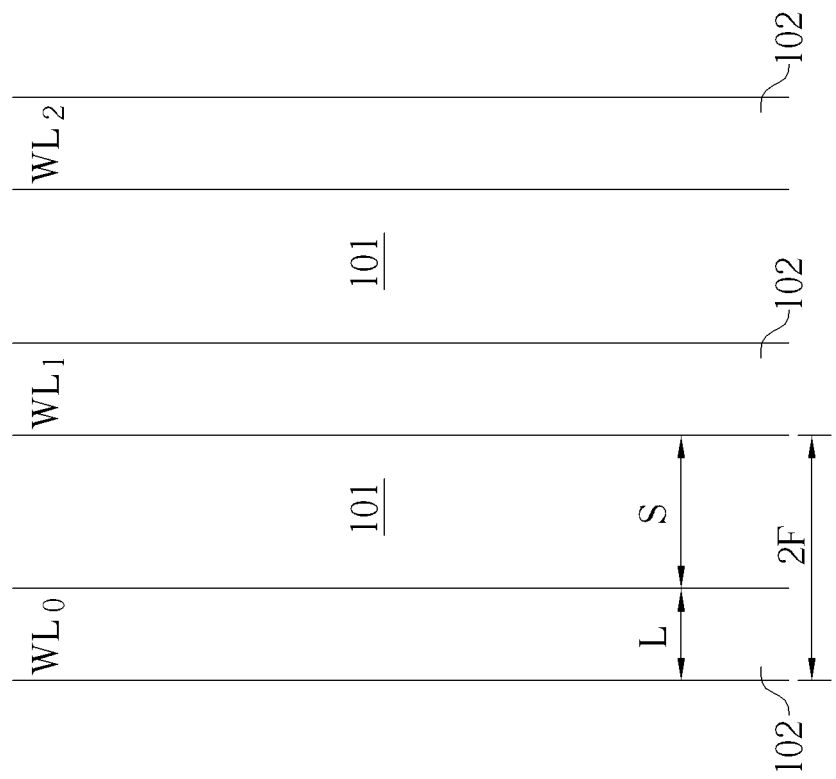

As shown in FIG. 7, an etching process is carried out to trim and modify the thickness of the photoresist dense line pattern 210 such that the line width L is reduced and the space S is increased. As shown in FIG. 8 and FIG. 8A, a dry etching process is performed to remove the hard mask material layer 103' and the word line material layer 102' not covered by modified the photoresist dense line pattern 210, thereby forming a plurality of word lines 102 such as WL0~WL2. The modified the photoresist dense line pattern 210 is then stripped. The hard mask layer 103 is remained on the word lines 102.

Figure 9:
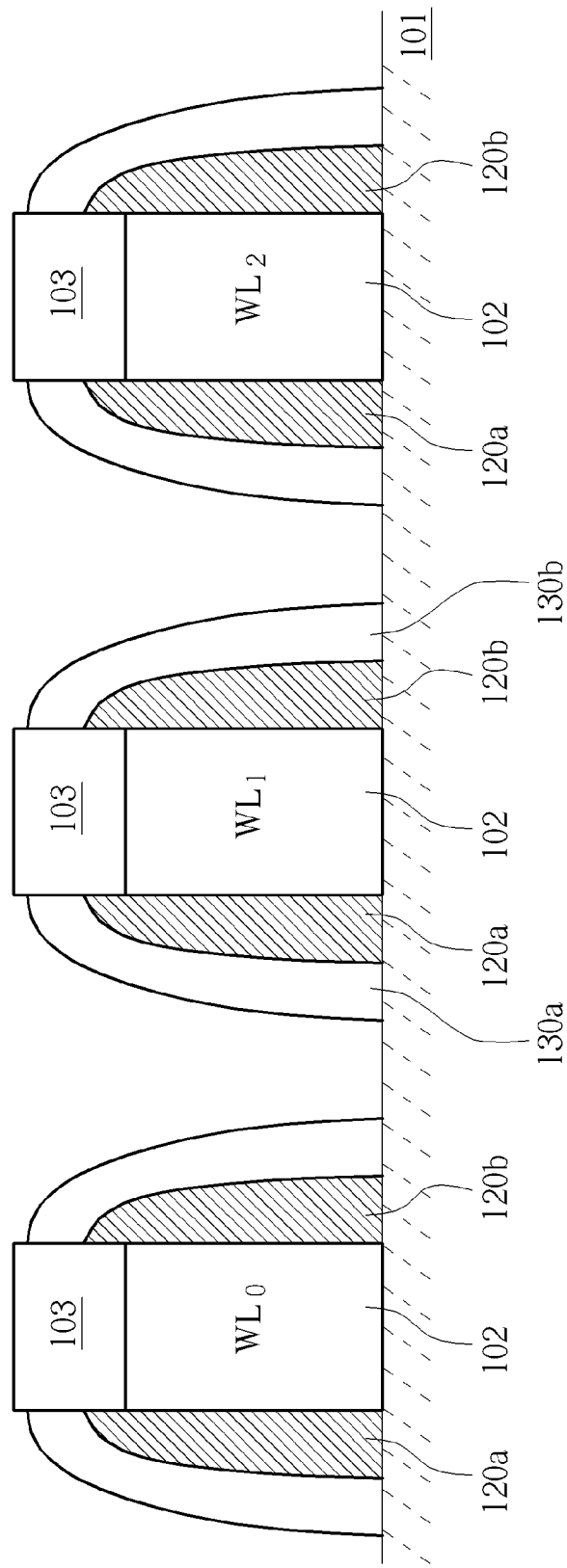

As shown in FIG. 9, subsequently, a spacer-type resistance layer 120a, 120b and top electrode 130a, 130b are formed on either sidewall of the word line 102 and hard mask layer 103. To form the spacer-type resistance layer 120a, 120b and top electrode 130a, 130b, a deposition method and self-aligned anisotropic etching process may be used, which are well-known in the art and the details are therefore omitted. The spacer-type resistance layer 120a, 120b may comprise $HfO_2$, $ZrO_2$, $TiO_2$, $Cu_xO$, $Al_2O_3$ or the like. The top electrode 130a, 130b may comprise TiN, but not limited thereto.

Figure 10:
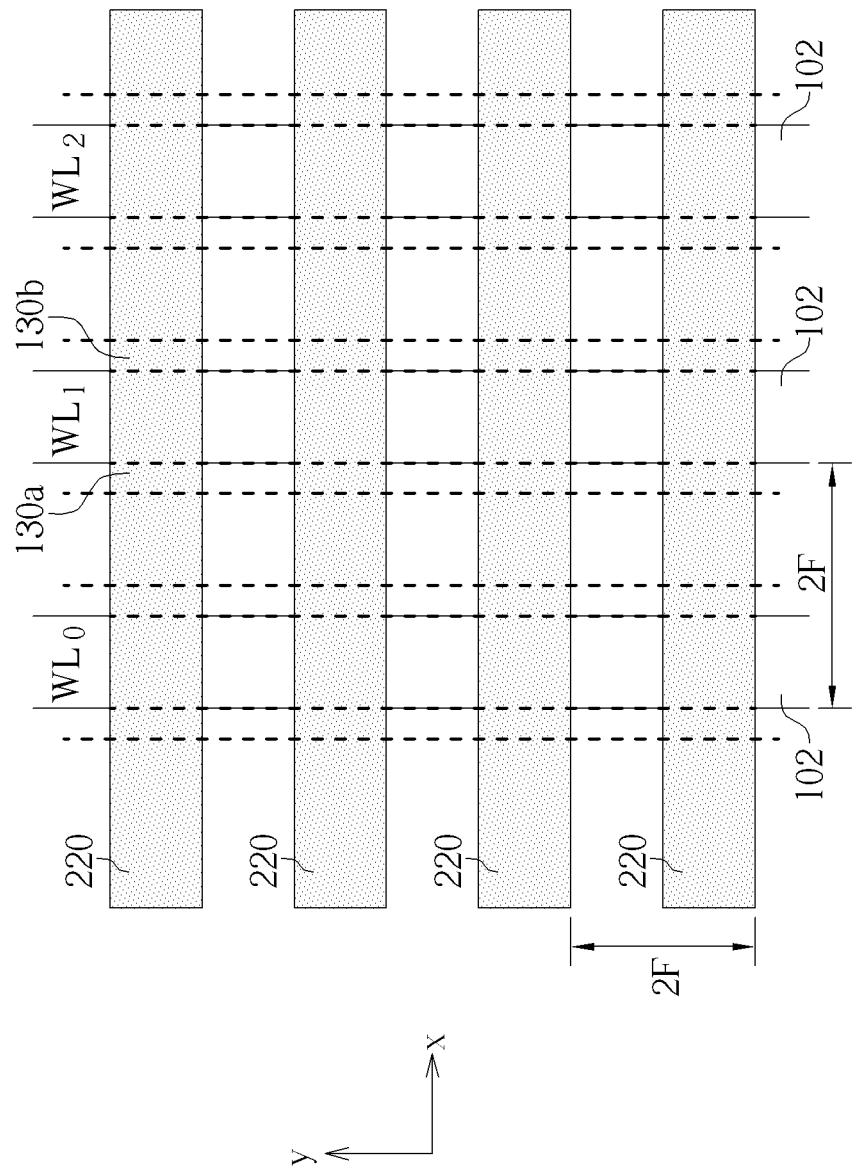
Figure 11:
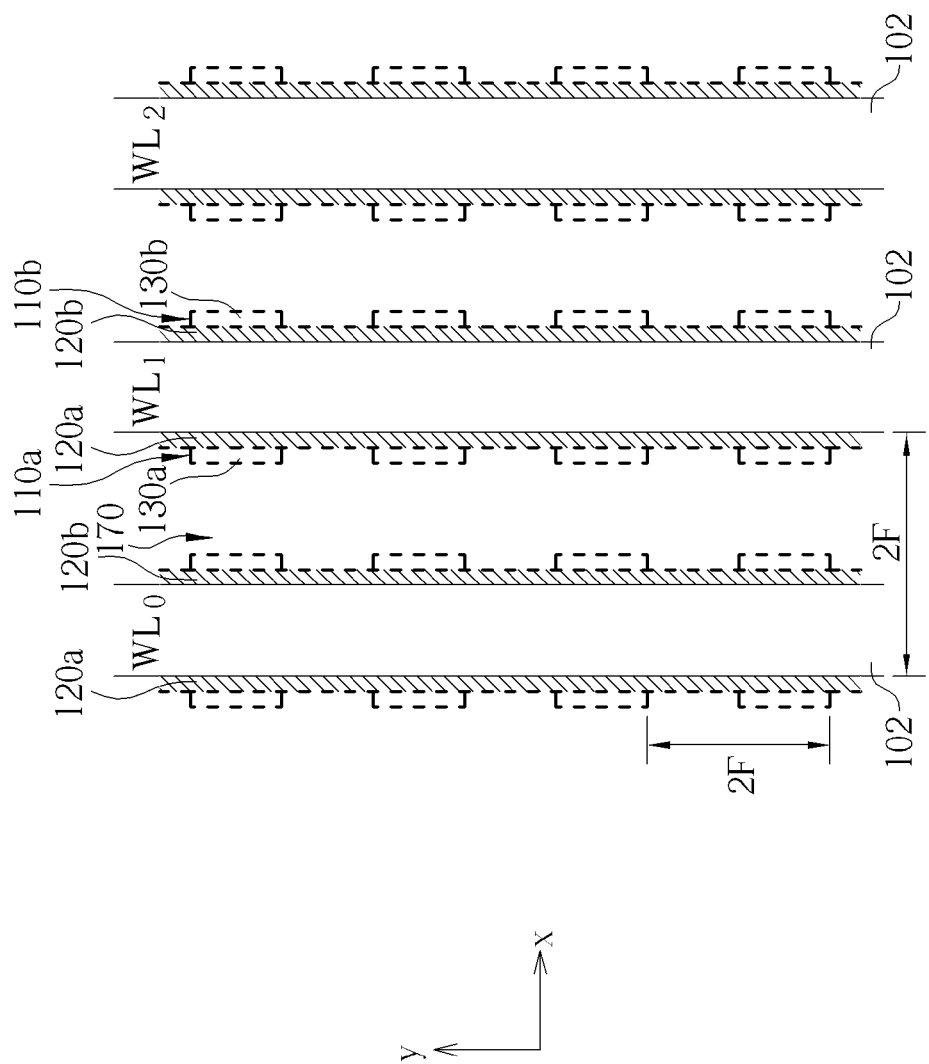

As shown in FIG. 10, a photoresist pattern 220 is formed on the substrate 101. The photoresist pattern 220 is stripe pattern extending along the reference x-axis, which intersects the word lines 102 and defines the position of the memory cells. As shown in FIG. 11, using the photoresist pattern 220 as an etch hard mask, a dry etching process is performed to remove the top electrode 130a, 130b not covered by the photoresist pattern 220 to thereby define the memory cells 110a and 110b on two opposite sidewalls of the word line 102. At this point, the spacer-type resistance layer 120a, 120b may remain continuous, not segmented, and extends along the reference y-axis.

Figure 12:
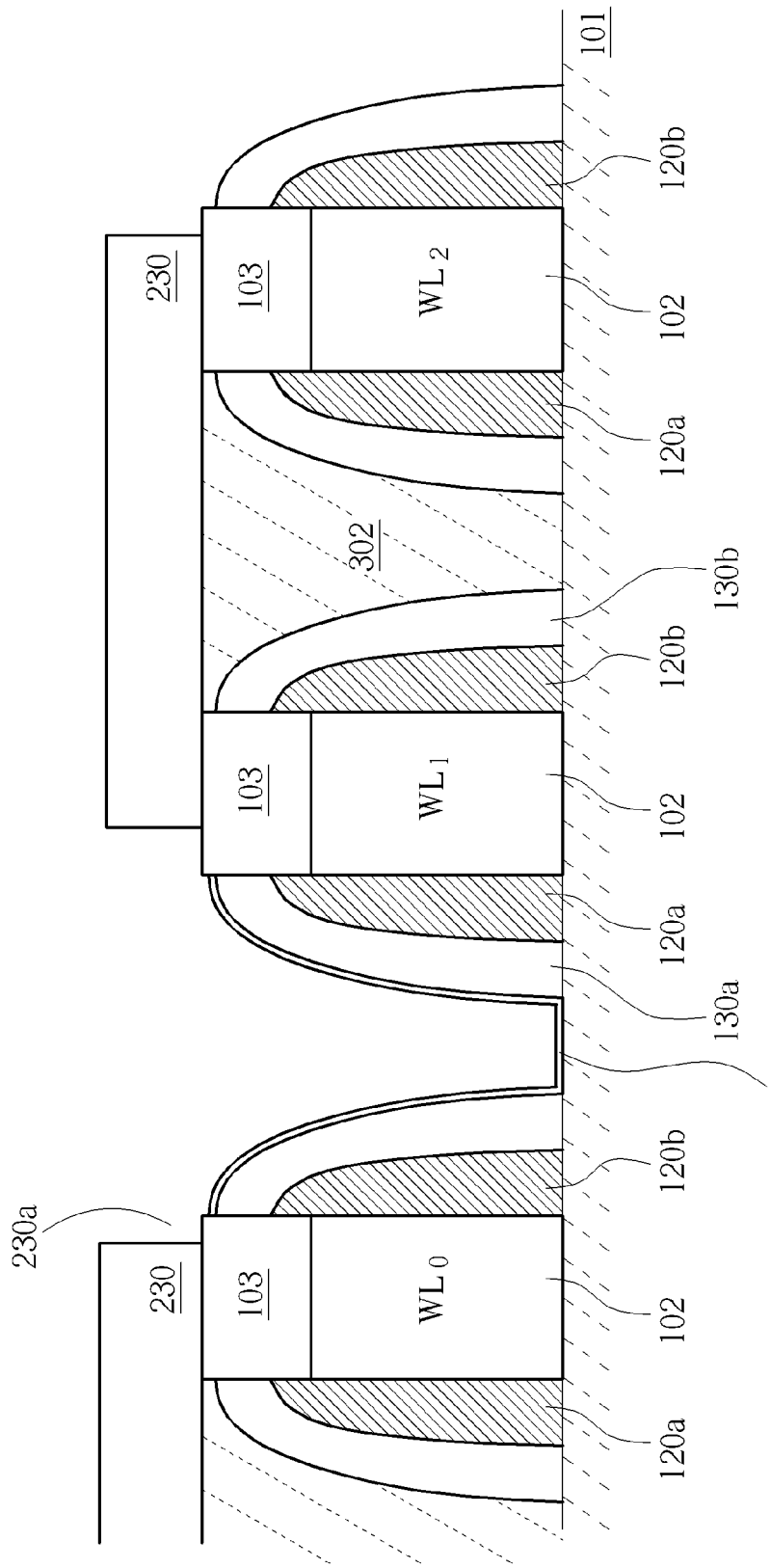
Figure 12A:
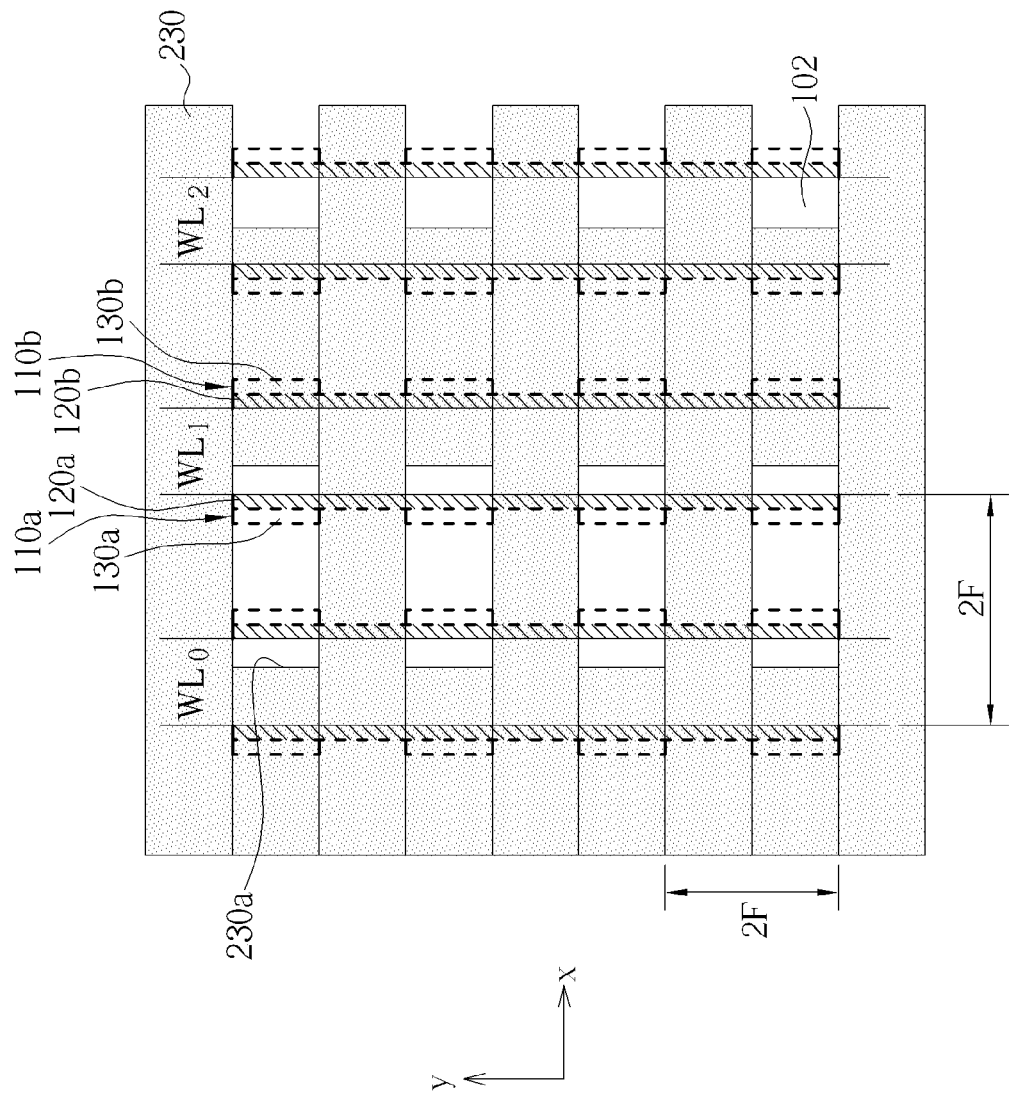

Subsequently, the diode elements are fabricated. As shown in FIG. 12 and FIG. 12A, for example, the recess between the word lines 102 is filled with a dielectric layer 302. A photoresist pattern 230 is then formed. The photoresist pattern 230 has a plurality of openings 230a that reveal odd columns of the dielectric layer 302 embedded in the recesses between the word lines 102. The exposed dielectric layer 302 is then removed through the openings 230a. Thereafter, a tunnel oxide layer 141 is formed in the recesses.

Figure 13:
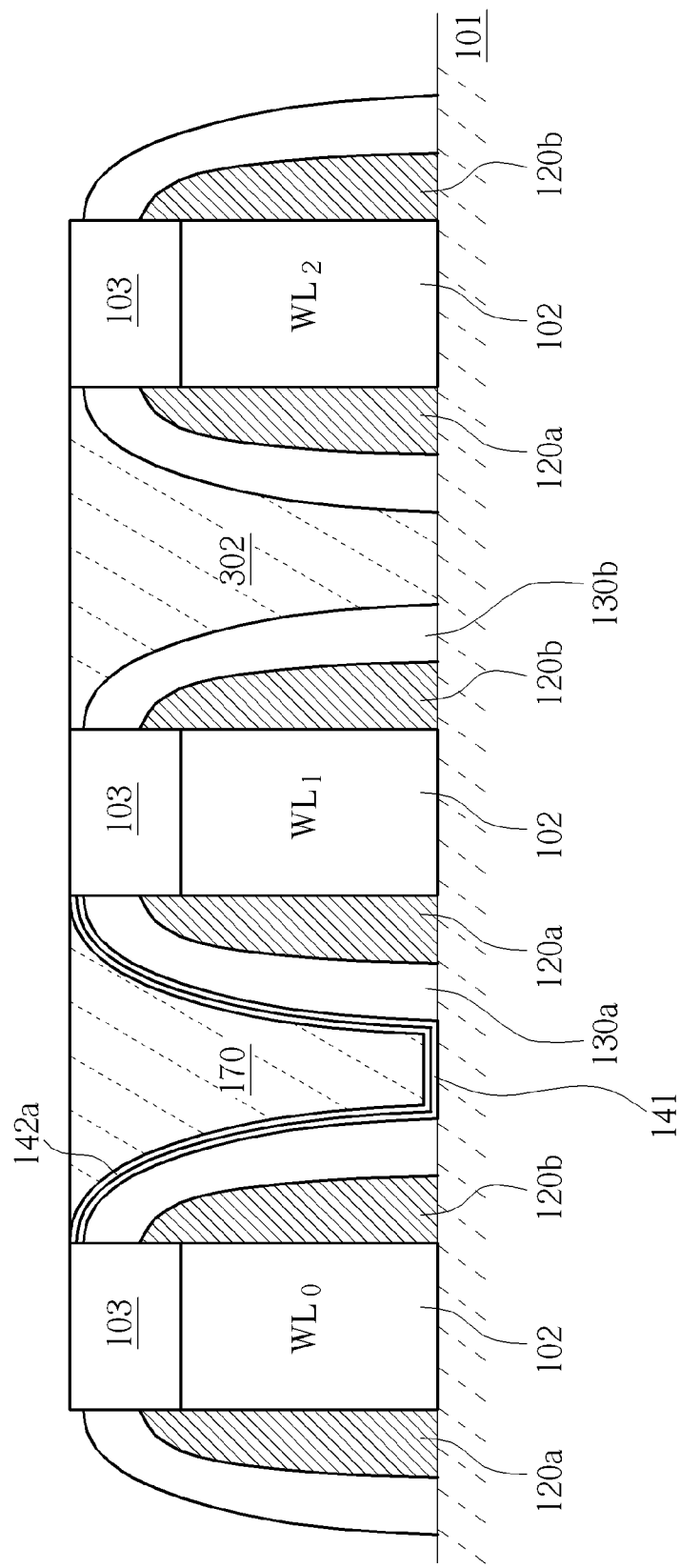

As shown in FIG. 13, a Pt layer 142a and contact layer 170 such as a tungsten layer are filled into the odd-column recesses between the word lines 102. A planarization process such as a chemical mechanical polishing (CMP) process may be performed to remove excess Pt layer 142a and contact layer 170.

Figure 14:
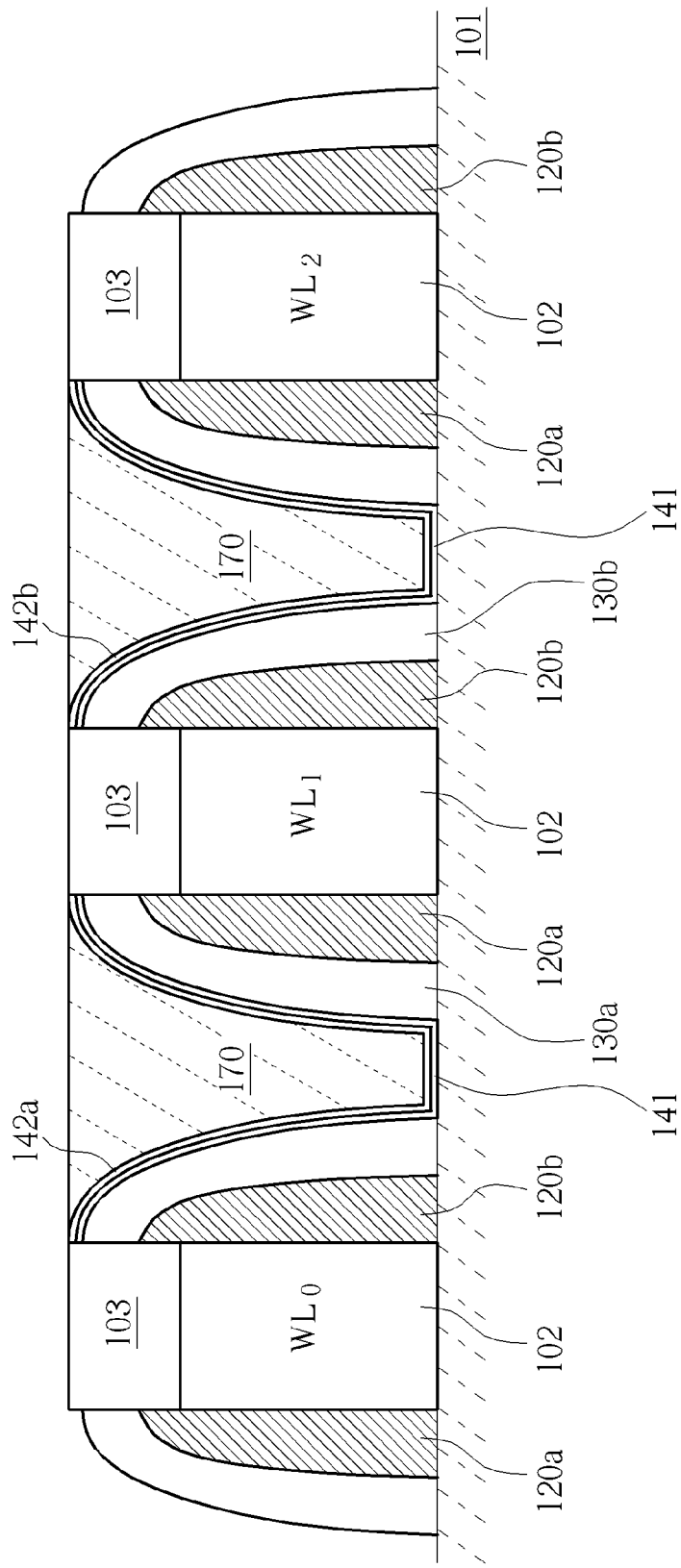
Figure 15:
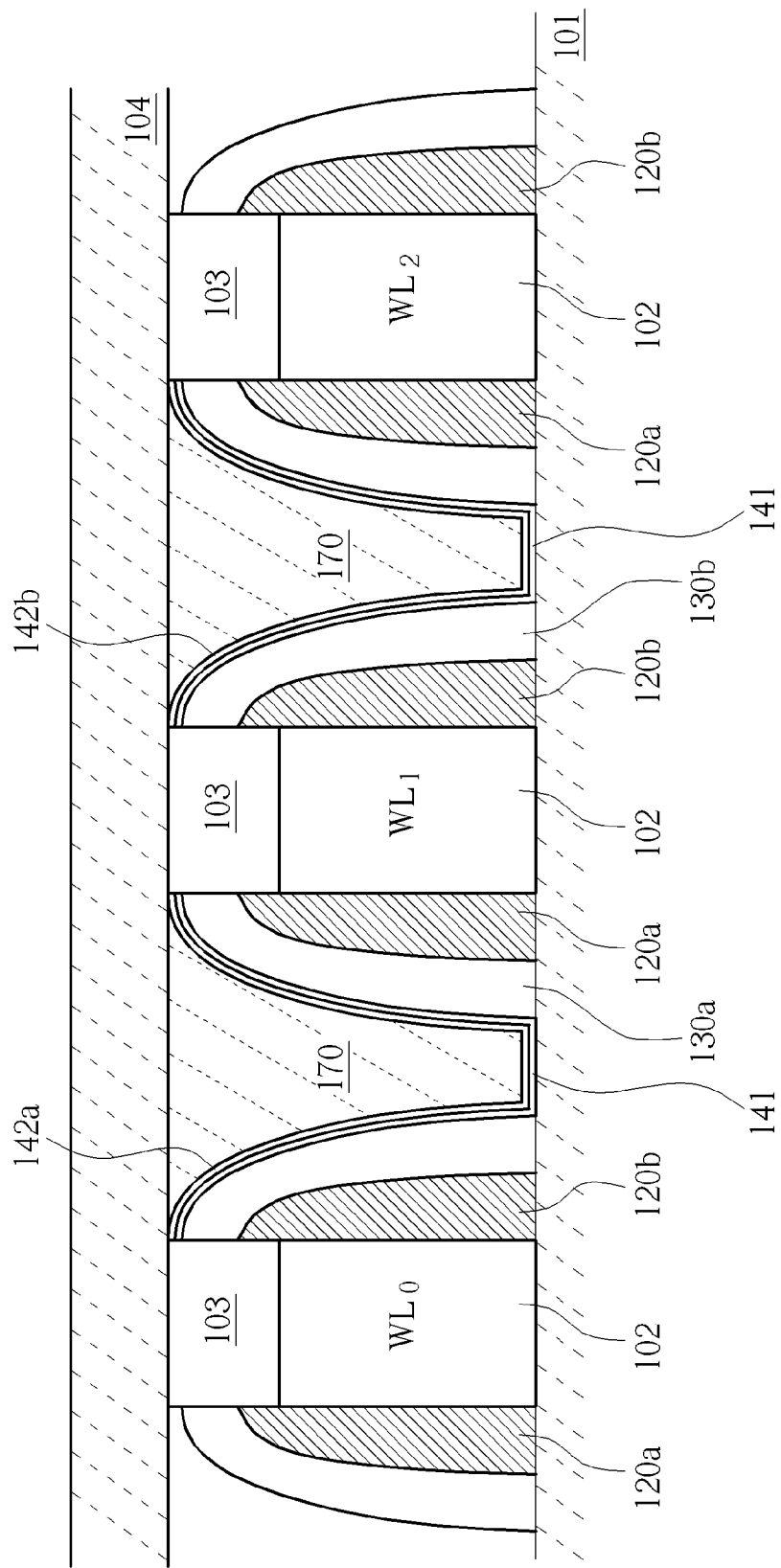

As shown in FIG. 14, the steps as described in FIG. 12, FIG. 12A and FIG. 13 are repeated to form the tunnel oxide layer 141, Hf layer 142b and contact layer 170 in the even-column recesses between the word lines 102. The excess Hf layer 142b and contact layer 170 are then removed using planarization process such as a CMP process. As shown in FIG. 15, a plurality of bit lines 104 are formed and the Pt layer 142a and Hf layer 142b are electrically connected to the bit line 104 through the contact layer 170.

According to the above-described embodiment, Pt layer 142a and Hf layer 142b are formed respectively on the left sidewall and light sidewall, thereby forming two diodes arranged in an inverted configuration. Therefore, the two memory cells on two opposite sidewalls of the word line can be operated independently. However, it is understood that in other embodiments the sidewalls of the word line may be covered with the same metal material to form two identical diodes, for example, two NP diodes or two PN diodes. In this case, the two memory cells on two sidewalls of the word line will be operated concurrently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random access memory (RRAM) device on a substrate, the RRAM device comprising:
    at least one bit line extending along a first direction;
    at least one word line extending along a second direction and intersecting the bit line;
    a hard mask layer directly positioned on the word line and interposed between the word line and the bit line;
    a first memory cell disposed on a first sidewall of the word line, the first memory cell from the sidewall of the word line sequentially comprising:
    a first spacer-type resistance layer;
    a first top electrode covering the first resistance layer and a first sidewall of the hard mask layer, wherein the first sidewall of the word line and the first sidewall of the hard mask layer are coplanar; and
    a first diode covering the first top electrode; and
    a second memory cell disposed on a second sidewall of the word line, the second memory cell from the other sidewall of the word line sequentially comprising:
    a second spacer-type resistance layer;
    a second top electrode covering the second resistance layer and a second sidewall of the hard mask layer, wherein the second sidewall of the word line and the second sidewall of the hard mask layer are coplanar; and
    a second diode covering the second top electrode.

2. The RRAM device according to claim 1 wherein the first diode and the second diode are electrically coupled to the bit line using a contact layer.

3. The RRAM device according to claim 2 wherein the first diode is an NP diode and the second diode is a PN diode, wherein an N electrode of the NP diode is coupled to the bit line through the contact layer and a P electrode of the PN diode is coupled to the bit line through the contact layer.

4. The RRAM device according to claim 2 wherein the first and second diodes are both an NP diode and an N electrode of the NP diode is coupled to the bit line through the contact layer.

5. The RRAM device according to claim 2 wherein the first and second diodes are both a PN diode and a P electrode of the PN diode is coupled to the bit line through the contact layer.

6. The RRAM device according to claim 1 wherein the first diode and the second diode comprise metal-tunnel oxide diode, metal diode or metal oxide diode.

7. The RRAM device according to claim 1 wherein the first and second spacer-type resistance layers comprise $HfO_2$, $ZrO_2$, $TiO_2$, $Cu_xO$, or $Al_2O_3$.

8. The RRAM device according to claim 1 wherein the first and second top electrodes comprise TiN.

9. The RRAM device according to claim 1 wherein the hard mask layer comprises silicon nitride.

10. The RRAM device according to claim 1 wherein the first direction is perpendicular to the second direction.

11. The RRAM device according to claim 1 wherein the substrate comprises a dielectric layer, and wherein the RRAM device is directly on the dielectric layer.

* * * * *